(12) United States Patent
Rumsey

(10) Patent No.: US 6,356,452 B1
(45) Date of Patent: Mar. 12, 2002

(54) SOLDERMASK OPENING TO PREVENT DELAMINATION

(75) Inventor: Brad D. Rumsey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/417,491

(22) Filed: Oct. 13, 1999

(51) Int. Cl.⁷ ................................................. H05K 7/02
(52) U.S. Cl. ........................ 361/760; 361/748; 361/736; 174/138; 174/260
(58) Field of Search ................................. 361/760, 718, 361/719, 720, 736, 748, 767, 795, 803, 808; 174/138, 255, 250

(56) References Cited

U.S. PATENT DOCUMENTS

| | | | |
|---|---|---|---|
| 4,801,069 A | 1/1989 | Ankrom et al. | 228/180.2 |
| 4,840,305 A | 6/1989 | Ankrom et al. | 228/232 |
| 4,847,446 A | 7/1989 | King et al. | 174/68.5 |
| 4,912,020 A | 3/1990 | King et al. | 430/311 |
| 5,214,845 A | 6/1993 | King et al. | 29/841 |
| 5,519,580 A * | 5/1996 | Natarajan et al. | 361/760 |
| 5,617,990 A | 4/1997 | Thompson, Sr. | 228/180.1 |
| 5,704,535 A | 1/1998 | Thompson, Sr. | 228/39 |
| 5,724,720 A | 3/1998 | Tuttle | 29/623.5 |
| 5,739,585 A | 4/1998 | Akram et al. | 257/698 |
| 5,796,590 A | 8/1998 | Klein | 361/774 |
| 5,851,899 A * | 12/1998 | Weigand | 438/427 |
| 5,852,870 A * | 12/1998 | Freyman et al. | 29/841 |
| 5,872,338 A * | 2/1999 | Lan et al. | 174/255 |
| 5,900,273 A | 5/1999 | Rasmussen et al. | 427/58 |
| 5,915,749 A | 6/1999 | Baldwin | 29/593 |
| 5,930,889 A | 8/1999 | Klein | 29/840 |
| 5,945,729 A | 8/1999 | Stroupe | 257/666 |
| 5,949,141 A | 9/1999 | Farnworth et al. | 257/737 |
| 5,981,314 A * | 11/1999 | Glenn et al. | 438/127 |
| 6,069,028 A | 5/2000 | Stroupe | 438/123 |
| 6,084,297 A * | 7/2000 | Brooks et al. | 257/698 |
| 6,085,962 A | 7/2000 | Jacobsen et al. | 228/103 |
| 6,124,637 A * | 9/2000 | Freyman et al. | 257/736 |
| 6,150,193 A * | 11/2000 | Glenn | 438/113 |

* cited by examiner

Primary Examiner—Jeffrey Gaffin
Assistant Examiner—Hung Bui
(74) Attorney, Agent, or Firm—Schwegman, Lundberg, Woessner & Kluth, P.A.

(57) ABSTRACT

A multilayer circuit board includes a base layer, a conductive layer and a soldermask. The soldermask layer has two sets of openings. One of the openings are vent openings, that expose the base layer to provide ventilation so that gases may escape during processing. The second openings expose selective regions of a conductor layer. The multi-layer circuit board provides for less occurrences of delamination.

40 Claims, 3 Drawing Sheets

SOLDERMASK OPENING TO PREVENT DELAMINATION

TECHNICAL FIELD OF THE INVENTION

The present invention relates generally to printed circuit boards production and, in particular, to the processes utilized to create printed circuit boards.

BACKGROUND OF THE INVENTION

A typical printed circuit board is a flat board that provides support and electrical interconnection between microchips and other electronic components. The base of the board can be made of reinforced fiberglass or plastic, and the electronic components are electrically interconnected by conductive pathways. There are several ways to make printed circuit boards. One method entails bonding a conductive foil, such as copper, over the base. A conductive pattern is then formed in the conductor. One method of patterning the metal layer uses a negative image of the desired circuit pattern and a photo resist layer. The photo resist is activated using the image such that selected areas of the photo resist can be removed. An etch process is then performed to remove the photo resist that was not activated and the underlying metal layer, leaving behind the conductive pathway pattern.

Today, most printed circuit boards are composed of several sheets or layers. A multi-layer printed circuit board may be fabricated from several composite sheets, each comprising a substrate of insulating material and a layer of metal, such as copper, attached to one surface of the substrate using a resin. A desired conductive pathway pattern is then provided in the metal layer, as explained, and multiple layers of insulating material and metal conductor layers can be fabricated. A soldermask layer can be provided over the top level of conductor to control areas exposed to a soldering process. A finished printed circuit board can then put through an assembly process where it is populated with various electrical components.

Delamination, or separation, problems have been discovered in the printed circuit board assembly industry regarding processes similar to the one described above. These problems are a result of the various environmental stresses inherent to assembly procedures. For example, delamination of the soldermask layer can occur when moisture retained by a board's constituent components are exposed to post-production assembly processes performed at high temperatures.

For the reasons stated above, and for other reasons stated below which will become apparent to those skilled in the art upon reading and understanding the present specification, there is a need for a multi-layer printed circuit board assembly that reduces the likelihood of delamination.

SUMMARY OF THE INVENTION

The above mentioned problems with circuit board assemblies and other problems are addressed by the present invention and which will be understood by reading and studying the following specification.

In one embodiment, a circuit board comprises a base layer, and a conductive layer located on a first side of the base layer. The conductive layer is patterned into conductive traces. A soldermask layer is located on a surface of the conductive layer and a region of the first side of the base layer which is not covered by the conductive layer. The soldermask layer is provided with a first plurality of openings to expose the base layer to provide ventilation, and wherein the soldermask layer is further provided with a second plurality of openings to expose the conductive traces.

In another embodiment, a circuit board assembly comprises a base layer, and a conductive layer located on top of the base layer. The conductive layer is patterned to form conductive traces. A soldermask is attached over the conductor layer and the base layer. The soldermask layer includes a first plurality of openings to expose a top surface of the base layer and a second plurality of openings to expose areas of the conductors. An integrated circuit is also attached to a first side of the circuit board.

DETAILED DESCRIPTION OF THE INVENTION

Figure 1:
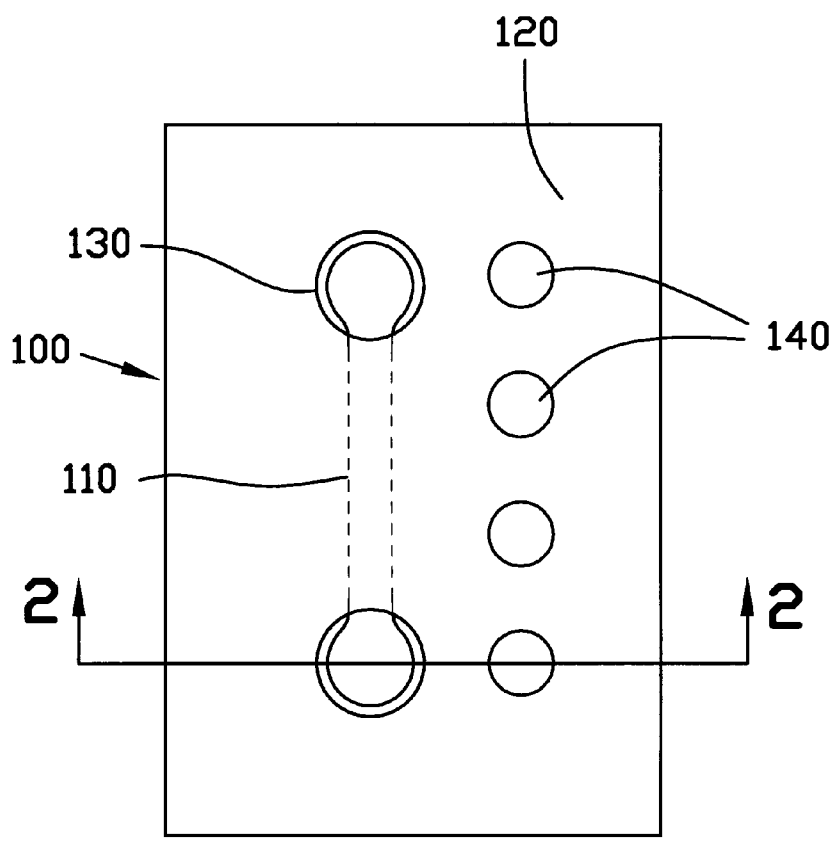
FIG. 1 is a top view of one embodiment of a simplified circuit board according to the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Printed circuit boards, as described above, can be fabricated using multiple layers of different materials. These materials can be insulators, conductors or other materials used to provide benefits during processing such as soldermask. Because these materials differ in composition, they behave differently to environmental conditions such as temperature and humidity. Of particular interest to the present invention is the retention of water, or other liquids, by insulating material used in fabrication of circuit boards.

Soldermasks, as known to those skilled in the art, are used to mask areas of a conductor to prevent solder from coating the conductor. That is, some areas of the conductor may be required to be coated in solder, while other areas need to be protected from solder. By controlling the location of solder, conductive shorts can be prevented.

The soldermask layer can be screen printed over the conductor. The soldermask includes openings to expose selected areas of the conductor. It is desired that the soldermask remain adhered during processing. If the soldermask layer delaminates from the conductor, conductive shorts or leakage paths can be formed.

The present invention provides a technique for reducing delamination of a soldermask layer of a circuit board which results from out-gassing of layers of the circuit board. FIG. 1 is a top view of a simplified circuit board 100 according to the present invention. The circuit board includes a conductor trace 110 and a soldermask used to shield the conductive layer from potential shorts by exposing only selected areas of the conductor via conductor openings 130. The soldermask also includes ventilation openings 140 to allow underlying layers of the circuit board to vent gases during processing without producing adverse side effects to the adhesion of the soldermask. A first plurality of openings are located in a region of the circuit board that accumulates undesirable gases. The details of the vent openings, or holes, are described in greater detail below.

Figure 2:
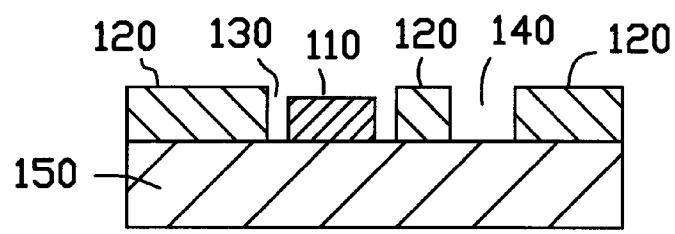
FIG. 2 is a cross section view of the circuit board shown in FIG. 1.

FIG. 2 illustrates a cross-section view of the circuit board of FIG. 1. The soldermask 120, or solder resist, allows access to the conductor 110 via conductor openings 130. Unlike prior soldermasks, the present invention provides an opening, vent holes 140 to expose a base layer 150. These openings allow for ventilation of the base layer. The base layer can be comprised of any electrically insulating material. In one embodiment, the base material is Mitsubishi HCL832. The base layer can be fabricated using multiple layers, and is not limited to a single material. The soldermask can be either a sheet of insulating material which is adhered to the top of the base layer and conductor or a conformal coating. In one embodiment, the soldermask is a sheet of Taiyo AUS5 which is adhered to the board using a screen printing operation. Likewise, the conductor traces can be any suitable conductive, or semi-conductive material such as copper.

As explained herein, the ventilation holes are provided in the soldermask layer to allow the base layer to out-gas. As such, the vent holes are located in a region of the circuit board which do not contain conductors. Because the soldermask in one embodiment is a sheet of material, the ventilation holes are patterned into a plurality of holes. That is, an array of holes is preferred to providing one large hole. The location and number of the ventilation holes will be dependant upon the design of the circuit board. In general, maximizing the cumulative surface area of ventilation holes in the locations not containing conductors is desired.

Figure 3:
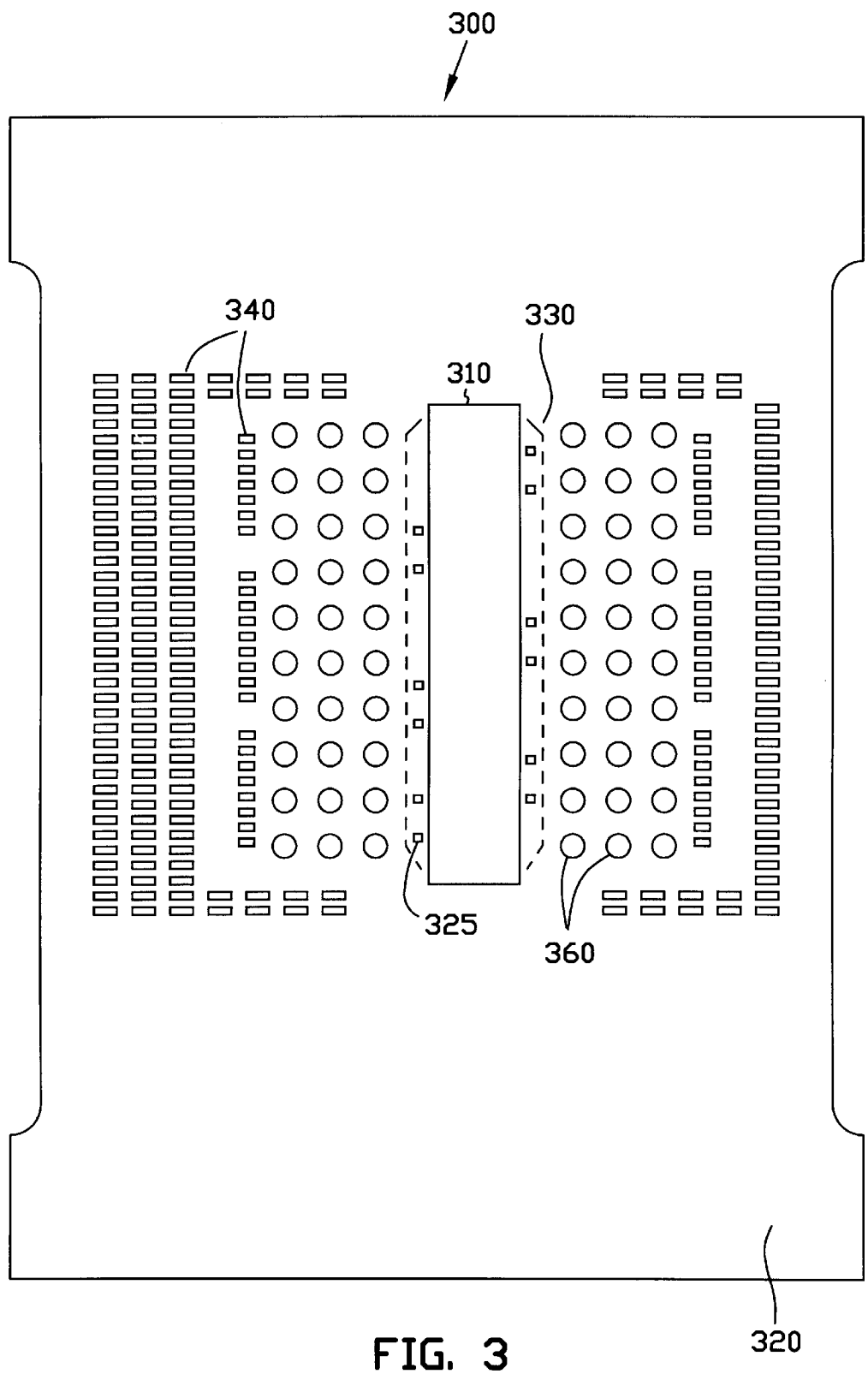
FIG. 3 is a top view of an embodiment of a detailed circuit board according to the present invention.
Figure 4:
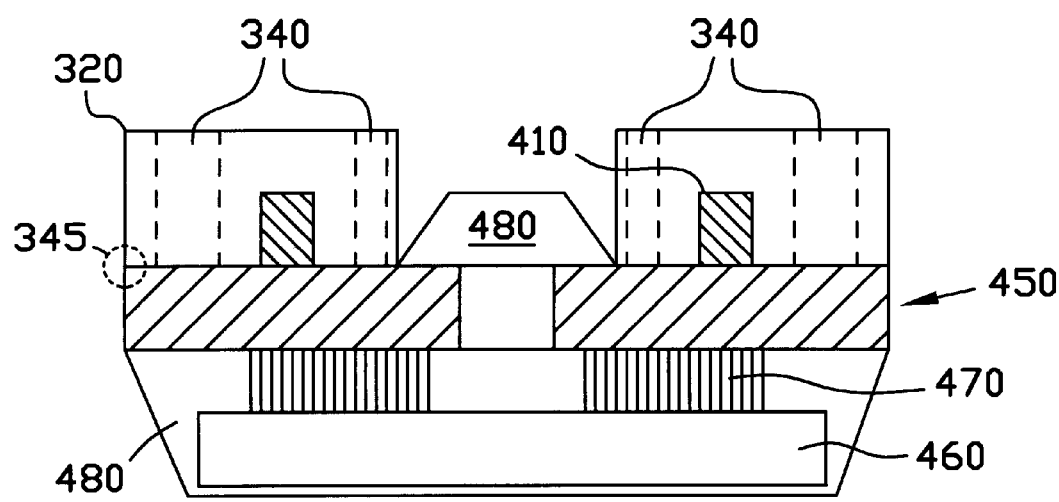
FIG. 4 is a cross section view of the circuit board shown in FIG. 3.

FIG. 3 provides a top view of another embodiment of a circuit board 300 according to the present invention, and FIG. 4 provides a cross-sectional view of the circuit board of FIG. 3. The circuit board includes a conductive grid array 360 for providing an interconnect for circuit components, such as but not limited to resistors, capacitors, inductors, and integrated circuits. The soldermask layer 320 includes first openings to provide access to the grid array conductors, and second opening 340 to expose the base layer. These openings are generally provided along outside edges of the circuits board.

An integrated circuit die assembly is fabricated using the circuit board 300, as illustrated in FIG. 4. The die assembly is comprised of the circuit board base layer 450 with a soldermask layer 320 concealing a conductive layer 410. A rectangular shaped opening, or aperture 310 is provided in the board. The opening passes through the soldermask layer, the conductive layer and the base layer. This opening provided access to an integrated circuit die, as explained below. A plurality of bond pads 325 are located in regions 330 of the circuit board outside the aperture. A plurality of solder bump conductor openings 360 are located on the same side of the circuit board as the bond pads.

The die assembly comprises the integrated circuit die (IC) 460 which has its top side affixed to the bottom side of the circuit board. The IC can be affixed to the board with an adhesive 470. The adhesive is applied to the IC's top side such bond connections provided on it's top side are exposed and fully accessible through aperture 310 when attached to the base layer. The IC can then be wire bonded through the opening to the bond pads provided in locations 330. The IC die and wire bonds are then encapsulated with a non-conductive encapsulant 480 to provide an environmental seal.

Again, the soldermask layer included ventilation openings 340 to allow the underlying layers to expel gases without adversely affecting the adherence of the soldermask layer. This is of particular interest when moisture retained by a board's constituent components (e.g. a soldermask layer or a base layer) are exposed to high temperatures delamination may occur in regions of the circuit board.

CONCLUSION

The invention allows gases trapped between layers of a multi-layered printed circuit board to escape, in an effort to prevent delamination. A circuit board has been described which includes openings in a particular layer(s) of the multi-level printed circuit board. The present invention describes an improved multi-layer circuit board that is more resistant to delamination problems. An embodiment of a multi-layer circuit board according to the present invention comprises a base layer, a conductive layer and a soldermask. The soldermask layer has two primary sets of openings. One of these sets are the vent openings, or vent holes, that expose the base layer to provide ventilation so that gases may escape. The circumference, location and depth of the holes are dependent upon the nature of the application. This invention allows a plurality of layers, such as the soldermask layer, to be used in printed circuit board applications, while preventing delamination throughout the board's surface. The reduction in delamination offers the added benefit of allowing for improved handling of the circuit board, particularly during various processing stages.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, by creating an avenue for gases to escape, the soldermask will remain attached at the board's perimeter, leaving a flat surface to clamp onto at the end of the assembly process. This makes further processing to the printed circuit board possible.

What is claimed is:

1. A circuit board, comprising:
   a base layer;
   a conductive layer located on a first side of the base layer, wherein the conductive layer is patterned into conductive traces; and
   a soldermask layer located on a surface of the conductive layer and laminated onto a region of the first side of the base layer which is not covered by the conductive layer, wherein the soldermask layer is provided with a first plurality of openings to expose the base layer to provide ventilation and reduce delamination of the soldermask from the base layer, and wherein the soldermask layer is further provided with a second plurality of openings to expose the conductive traces.

2. The circuit board of claim 1 wherein the first plurality of openings are located in a region of the circuit board that accumulates undesirable gases.

3. The circuit board of claim 1 wherein the conductive layer comprises copper.

4. The circuit board of claim 1 wherein the second plurality of openings expose regions of both the conductive layer and base layer.

5. A circuit board assembly comprising:
a circuit board comprising a base layer, and a conductive layer located on top of the base layer, the conductive layer is patterned to form conductive traces;
a soldermask attached over the conductive layer and laminated onto the base layer, the soldermask layer includes a first plurality of openings to expose a top surface of the base layer and a second plurality of openings to expose areas of the conductive layer; and
an integrated circuit attached to a side of the circuit board opposite the conductive layer.

6. The circuit board assembly of claim 5 wherein the integrated circuit is a die attached to the circuit board and environmentally encapsulated.

7. The circuit board assembly of claim 6 wherein the base layer includes an opening for accessing the die with a conductive connection.

8. The circuit board assembly of claim 5 wherein an electrical component is mounted on a top side of the circuit board such that at least one electrical connection is provided from the electrical component to at least one exposed conductive trace.

9. The circuit board assembly of claim 5 wherein the second plurality of openings are patterned to form an array for attaching solder balls to the conductor layer.

10. The circuit board assembly of claim 5 wherein the first plurality of openings are generally located along outside edges of the circuit board.

11. The circuit board assembly of claim 5 wherein a first plurality of openings are located in a region of the circuit board that accumulates undesirable gas during processing.

12. The circuit board assembly of claim 5 wherein the second plurality of openings expose regions of both the conductive layer and base layer.

13. An assembly, comprising:
a circuit board having a base and at least one conductive trace on top of the base;
a soldermask laminated onto a region of the base and attached over the at least one conductive trace, the soldermask layer includes a first plurality of openings to expose a top surface of the region and a second plurality of openings to expose areas of the at least one conductive trace, wherein the first plurality of openings ventilates the region of the base and prevents delamination; and
an integrated circuit attached to a side of the circuit board opposite the at least one conductive trace.

14. The assembly of claim 13, wherein the integrated circuit is a die attached to the circuit board and encapsulated.

15. The assembly of claim 14, wherein the base includes an opening for accessing the die with a conductive connection.

16. The assembly of claim 13, wherein the second plurality of openings are patterned to form an array for attaching solder balls to the at least one conductive trace.

17. The assembly of claim 13, wherein the first plurality of openings are generally located along outside edges of the circuit board.

18. The assembly of claim 13, wherein the first plurality of openings are located in a region of the circuit board that accumulates undesirable gas during processing.

19. The assembly of claim 13, wherein the second plurality of openings expose regions of both the at least one conductive trace and base.

20. An assembly, comprising:
a circuit board having a base and at least one conductive trace on top of the base;
a soldermask laminated onto a region of the base and attached over the at least one conductive trace, the soldermask layer includes a first plurality of openings to expose a top surface of the base and a second plurality of openings to expose areas of the at least one conductive trace, wherein the first plurality of openings ventilates the region of the base and prevents delamination of the soldermask from the region;
an integrated circuit attached to a first side of the circuit board opposite the at least one conductive trace; and
an electrical component mounted on a second side of the circuit board such that at least one electrical connection is provided from the electrical component to the at least one conductive trace.

21. The assembly of claim 20, wherein the second plurality of openings are patterned to form an array for attaching solder balls to the conductor layer.

22. The assembly of claim 20, wherein the first plurality of openings are generally located along outside edges of the circuit board.

23. The assembly of claim 20, wherein the first plurality of openings are located in a region of the circuit board that accumulates undesirable gas during processing.

24. The assembly of claim 20, wherein the second plurality of openings expose regions of both the at least one conductive trace and base.

25. The assembly of claim 20, wherein the integrated circuit is a die attached to the circuit board and encapsulated.

26. The assembly of claim 25, wherein the base includes an opening for accessing the die with a conductive connection.

27. An assembly, comprising:
a circuit board having a base and at least one conductive trace on top of the base;
a soldermask laminated onto the base and over the at least one conductive trace, the soldermask layer includes a first plurality of openings to expose a top surface of the base and a second plurality of openings to expose areas of the at least one conductive trace and patterned to form an array for attaching solder balls to the at least one conductive trace, wherein the first plurality of openings are generally located along outside edges of the circuit board, wherein the first plurality of openings ventilates the region of the base and prevents delamination;
an integrated circuit attached to a first side of the circuit board opposite the at least one conductive trace; and
an electrical component mounted on a second side of the circuit board such that at least one electrical connection is provided from the electrical component to the at least one conductive trace.

28. The assembly of claim 27, wherein the integrated circuit is a die attached to the circuit board and encapsulated.

29. The assembly of claim 28, wherein the base includes an opening for accessing the die with a conductive connection.

30. An assembly, comprising:
a circuit board having a base and at least one conductive trace on top of the base;
a soldermask laminated onto the base and over the at least one conductive trace, the soldermask layer includes a first plurality of openings to expose a top surface of the base and a second plurality of openings to expose areas of the at least one conductive trace and patterned to form an array for attaching solder balls to the at least one conductive trace, wherein the first plurality of openings are located in a region of the circuit board that accumulates undesirable gas during processing, wherein the first plurality of openings ventilates the base and prevents delamination of the soldermask;

an integrated circuit attached to a first side of the circuit board opposite the at least one conductive trace; and an electrical component mounted on a second side of the circuit board such that at least one electrical connection is provided from the electrical component to the at least one conductive trace.

31. The assembly of claim 30, wherein the integrated circuit is a die attached to the circuit board and encapsulated.

32. The assembly of claim 31, wherein the base includes an opening for accessing the die with a conductive connection.

33. A circuit board, comprising:

a base;

a conductive layer located on a first side of the base, wherein the conductive layer is patterned into conductive traces; and a soldermask layer located on a surface of the conductive layer and laminated onto a region of the first side of the base which is not covered by the conductive layer, wherein the soldermask layer is provided with a first plurality of openings to expose only the base to provide ventilation and prevent delamination of the soldermask from the base, and wherein the soldermask layer is further provided with a second plurality of openings to expose the conductive traces.

34. The circuit board of claim 33, wherein the first plurality of openings are located in a region of the circuit board that accumulates undesirable gases.

35. The circuit board of claim 33, wherein the conductive layer comprises copper.

36. The circuit board of claim 33, wherein the second plurality of openings expose regions of both the conductive layer and base.

37. A circuit board, comprising:

a base;

a conductive layer located on a first side of the base, wherein the conductive layer is patterned into conductive traces;

a soldermask layer located a surface of the conductive layer and laminated onto a region of the first side of the base which is not covered by the conductive layer; and means for preventing delamination of the soldermask from the region of the base.

38. The circuit board of claim 37, wherein the means for preventing delamination includes a plurality of ventilation holes.

39. The circuit board of claim 38, wherein the plurality of ventilation holes have a surface area maximized in locations free of conductors.

40. The circuit board of claim 37, and wherein the means for preventing delamination includes a plurality of openings to expose the conductive traces and the base.

* * * * *